(12) United States Patent
Kim et al.

(10) Patent No.: US 11,158,656 B2
(45) Date of Patent: Oct. 26, 2021

(54) DISPLAY SUBSTRATE COMPRISING A PLURALITY OF CONDUCTIVE PATTERNS

(71) Applicant: SAMSUNG DISPLAY CO., LTD., Yongin-si (KR)

(72) Inventors: Ji-Sun Kim, Seoul (KR); Ji-Hyun Kim, Seoul (KR); Shin-Il Choi, Hwaseong-si (KR); Yeong-Keun Kwon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 22 days.

(21) Appl. No.: 16/569,452

(22) Filed: Sep. 12, 2019

(65) Prior Publication Data
US 2020/0006399 A1    Jan. 2, 2020

Related U.S. Application Data

(62) Division of application No. 15/594,325, filed on May 12, 2017, now Pat. No. 10,446,587, which is a
(Continued)

(30) Foreign Application Priority Data

Aug. 12, 2013  (KR) .......................... 10-2013-0095323

(51) Int. Cl.
*H01L 27/12* (2006.01)

(52) U.S. Cl.
CPC ........ *H01L 27/1244* (2013.01); *H01L 27/124* (2013.01); *H01L 27/1248* (2013.01); *H01L 27/1259* (2013.01)

(58) Field of Classification Search
CPC ............... H01L 27/124; H01L 27/1244; H01L 27/1248; H01L 27/1259
See application file for complete search history.

(56) References Cited

U.S. PATENT DOCUMENTS

| 8,405,811 B2 | 3/2013 | Kim et al. |
| 9,666,613 B2 | 5/2017 | Kim et al. |

(Continued)

FOREIGN PATENT DOCUMENTS

| JP | 2012-078694 | 4/2012 |
| KR | 10-2012-0056469 | 6/2012 |

(Continued)

*Primary Examiner* — Eduardo A Rodela
*Assistant Examiner* — Christopher M Roland
(74) *Attorney, Agent, or Firm* — F. Chau & Associates, LLC

(57) ABSTRACT

A display substrate includes a switching element disposed in a display region that is electrically connected to a gate line, a data line, and a first electrode in a peripheral region adjacent to the display region that includes a first conductive pattern formed from a first conductive layer that includes a same material as the gate line, a first line connecting part disposed in the peripheral region that includes the first conductive pattern, a second conductive pattern that overlaps the first conductive pattern and formed, an organic layer that partially exposes the second conductive pattern, and a third conductive pattern electrically connected to the second conductive pattern that contacts the partially exposed second conductive pattern, and a fourth conductive pattern that electrically connects the first conductive pattern of the pad part and the third conductive pattern of the first line connecting part.

6 Claims, 22 Drawing Sheets

Related U.S. Application Data division of application No. 14/247,818, filed on Apr. 8, 2014, now Pat. No. 9,666,613.

(56) References Cited

U.S. PATENT DOCUMENTS

| | | | |
|---|---|---|---|
| 2002/0021376 A1* | 2/2002 | Yoo | G02F 1/136204 349/40 |
| 2003/0168746 A1* | 9/2003 | You | H01L 27/1288 257/759 |
| 2003/0197814 A1* | 10/2003 | Choi | G02F 1/136204 349/40 |
| 2007/0059855 A1 | 3/2007 | Shih | |
| 2007/0065991 A1 | 3/2007 | Kim et al. | |
| 2007/0153202 A1 | 7/2007 | Kang | |
| 2008/0174711 A1* | 7/2008 | Jung | G02F 1/13458 349/46 |
| 2008/0180622 A1 | 7/2008 | Horiguchi et al. | |
| 2009/0256150 A1 | 10/2009 | Yoon et al. | |
| 2010/0038642 A1 | 2/2010 | Choi et al. | |
| 2010/0128192 A1 | 5/2010 | Kim et al. | |
| 2010/0244021 A1 | 9/2010 | Uochi et al. | |
| 2011/0019144 A1* | 1/2011 | Koh | H01L 27/124 349/143 |
| 2011/0228204 A1 | 9/2011 | Watanabe | |
| 2012/0038585 A1 | 2/2012 | Kim | |
| 2012/0086009 A1 | 4/2012 | Shin et al. | |
| 2013/0063673 A1 | 3/2013 | Choi et al. | |
| 2017/0250203 A1 | 8/2017 | Kim et al. | |

FOREIGN PATENT DOCUMENTS

| | | |
|---|---|---|
| KR | 10-2012-0107269 | 10/2012 |
| KR | 10-2013-0020476 | 2/2013 |

* cited by examiner

DISPLAY SUBSTRATE COMPRISING A PLURALITY OF CONDUCTIVE PATTERNS

CROSS-REFERENCE TO RELATED APPLICATION

This application is a divisional of U.S. application Ser. No. 15/594,325, filed on May 12, 2017 in the U.S. Patent and Trademark Office, which is a divisional of U.S. application Ser. No. 14/247,818, filed on Apr. 8, 2014 in the U.S. Patent and Trademark Office, which in turns claims priority under 35 U.S.C. § 119 from Korean Patent Application No. 10-2013-0095323, filed on Aug. 12, 2013, in the Korean Intellectual Property Office (KIPO), and all the benefits accruing therefrom, the contents of all of which are herein incorporated by reference in their entirety.

TECHNICAL FIELD

Exemplary embodiments of the present disclosure are directed to a display substrate and a method of manufacturing the display substrate. More particularly, exemplary embodiments of the present disclosure are directed to a display substrate including an organic layer and a method of manufacturing the display substrate.

DISCUSSION OF THE RELATED ART

In general, a liquid crystal display device includes a first display substrate, a second display substrate opposite to the first display substrate and a liquid crystal layer disposed between the first display substrate and the second display substrate.

The first display substrate typically includes a gate line, a data line, a switching element connected to the gate line and the data line, a gate insulating layer disposed on a gate electrode of the switching element, a protecting layer disposed on source and drain electrodes of the switching element that partially exposes the drain electrode, and a pixel electrode electrically connected to the switching element.

The pixel electrode is formed over the gate line or the data line. The pixel electrode may overlap with the gate line or the data line, or be spaced apart from the gate line or the data line. Thus, parasitic capacitance between the pixel electrode and the gate line or the data line may be generated.

The first display substrate may further include an organic layer to increase a distance between the pixel electrode and the gate line or the data line, to reduce parasitic capacitance between the pixel electrode and the gate line or the data line.

The organic layer may be removed to attach a driving chip in a region in which the driving chip is disposed. Thus, a data metal pattern in a region in which the organic layer is removed may be damaged in manufacturing processes.

SUMMARY

According to an exemplary embodiment of the present disclosure, a display substrate includes a switching element disposed in a display region that is connected to a gate line, a data line, and a first electrode, a pad part disposed in a peripheral region adjacent to the display region that includes a first conductive pattern formed from a first conductive layer that includes the same material as the gate line, a first line connecting part disposed in the peripheral region that includes the first conductive pattern, a second conductive pattern that overlaps the first conductive pattern, an organic layer that partially exposes the second conductive pattern, and a third conductive pattern electrically connected to the second conductive pattern that contacts the partially exposed second conductive pattern, and a fourth conductive pattern that electrically connects the first conductive pattern of the pad part and the third conductive pattern of the first line connecting part.

In an exemplary embodiment of the present disclosure, the switching element may include a gate electrode formed from the first conductive layer and a source electrode and a drain electrode formed from a same layer as the second conductive pattern.

In an exemplary embodiment of the present disclosure, the display substrate may further include a first contact part that includes the first conductive pattern and the organic layer, wherein said organic layer partially exposes the first conductive pattern, a second contact part that includes the second conductive pattern, the organic layer that partially exposes the second conductive pattern, and the third conductive pattern electrically connected to the second conductive pattern and that contacts the partially exposed second conductive pattern, wherein the fourth conductive pattern electrically connects the partially exposed first conductive pattern of the first contact part and the third conductive pattern of the second contact part.

In an exemplary embodiment of the present disclosure, the third conductive pattern may be formed from a same layer as the first electrode.

In an exemplary embodiment of the present disclosure, the third conductive pattern may include a transparent conductive material.

In an exemplary embodiment of the present disclosure, the display substrate may further comprise a second electrode disposed on the first electrode that overlaps the first electrode, and the fourth conductive pattern may be formed from a same layer as the second electrode.

In an exemplary embodiment of the present disclosure, the fourth conductive pattern may include a transparent conductive material.

According to an exemplary embodiment of the present disclosure, a display substrate includes a switching element disposed in a display region that connects with a gate line, a data line, and a first electrode, and a pad part disposed in a peripheral region adjacent to the display region that includes a first conductive pattern formed from a first conductive layer that includes a same material as the gate line, and a second conductive pattern that contacts the first conductive pattern.

In an exemplary embodiment of the present disclosure, the switching element may include a source electrode and a drain electrode formed from the first conductive layer and a gate electrode formed from a third conductive layer.

In an exemplary embodiment of the present disclosure, the second conductive pattern may be formed from a same layer as the first electrode.

In an exemplary embodiment of the present disclosure, the second conductive pattern may include a transparent conductive material.

In an exemplary embodiment of the present disclosure, the pad part may further include a third conductive pattern disposed on the second conductive pattern that electrically connects to the second conductive pattern.

In an exemplary embodiment of the present disclosure, the display substrate may further comprise a second electrode disposed on the first electrode that overlaps the first electrode, and the third conductive pattern may be formed with the same layer as the second electrode.

In an exemplary embodiment of the present disclosure, the third conductive pattern may include a transparent conductive material.

According to an exemplary embodiment of the present disclosure, a method of manufacturing a display substrate includes forming a first conductive pattern on a base substrate, forming a second conductive pattern on the first conductive pattern, forming an organic layer on the second conductive pattern, and partially removing the organic layer to expose a portion of the second conductive pattern. The second conductive pattern is formed from a same layer as a source electrode and a drain electrode.

In an exemplary embodiment of the present disclosure, the method may further include forming a third conductive pattern on the second conductive pattern to cover the portion of the second conductive pattern exposed by the organic layer.

In an exemplary embodiment of the present disclosure, the third conductive pattern may be formed from a same layer as a first electrode electrically connected to the drain electrode.

In an exemplary embodiment of the present disclosure, the method of manufacturing a display substrate may further include forming a protective layer on the third conductive pattern, patterning the protective layer to expose a portion of the first conductive pattern and a portion of the third conductive pattern and forming a fourth conductive pattern on the partially exposed first conductive pattern and the third conductive pattern.

In an exemplary embodiment of the present disclosure, the first conductive pattern may be formed from a same layer as a gate electrode.

In an exemplary embodiment of the present disclosure, the third conductive pattern may be formed from a same layer as a first electrode electrically connected to the drain electrode, and the fourth conductive pattern may be formed from a same layer as a second electrode supplied with a common voltage.

According to an exemplary embodiment of the present disclosure, pads of the flexible pad part and the circuit mounted parts are formed from a gate metal pattern, and a conductive pattern covers the partially exposed data metal pattern. Thus, damage to the data metal pattern may be prevented in subsequent processes.

In addition, when pads of the flexible pad part and the circuit mounted parts are formed from a data metal pattern, a conductive pattern covers the partially exposed data metal pattern.

Thus, damage to the data metal pattern may be prevented in subsequent processes.

DETAILED DESCRIPTION OF EXEMPLARY EMBODIMENTS

Hereinafter, exemplary embodiments of the present disclosure will be described in detail with reference to the accompanying drawings.

Figure 1:
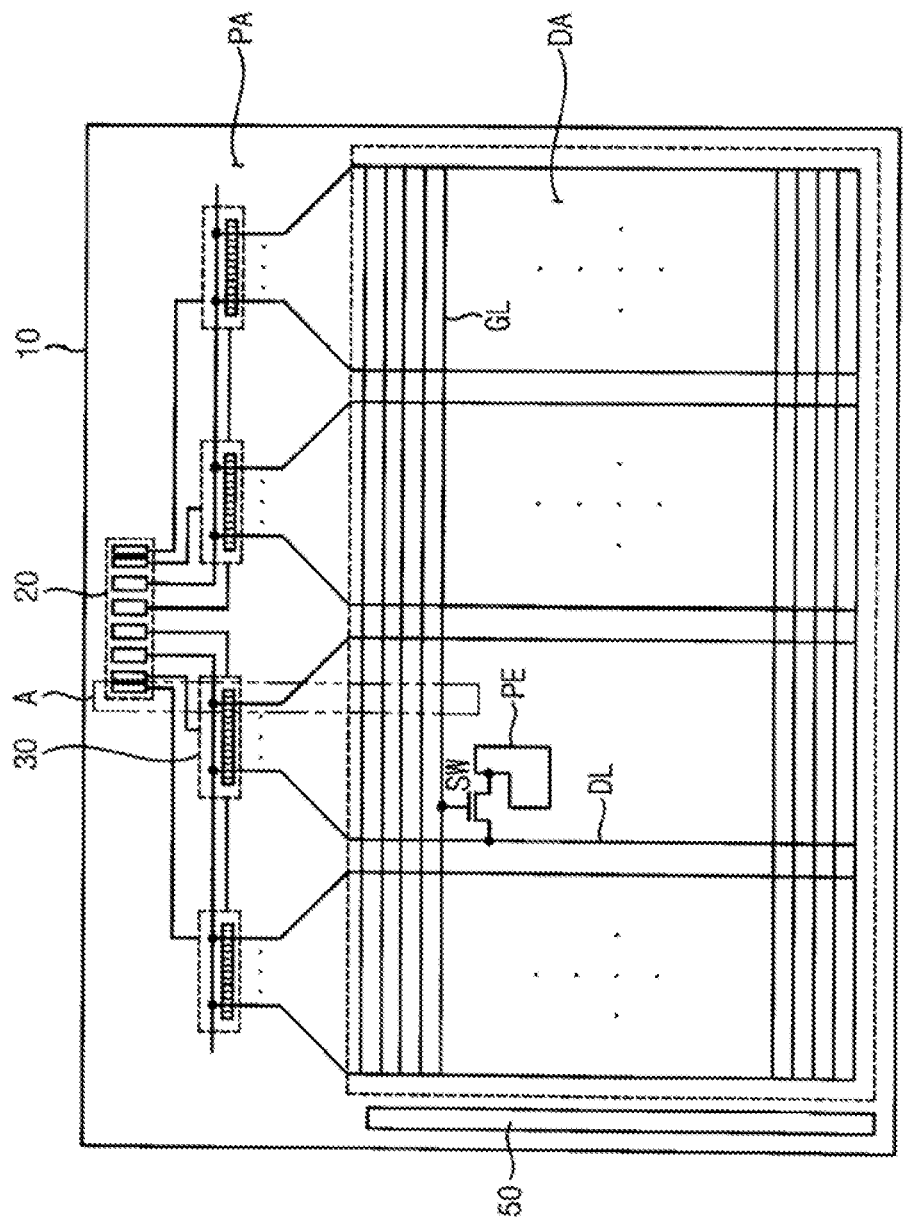
FIG. 1 is a plan view that illustrates a display substrate according to an exemplary embodiment of the present disclosure.
Figure 2:
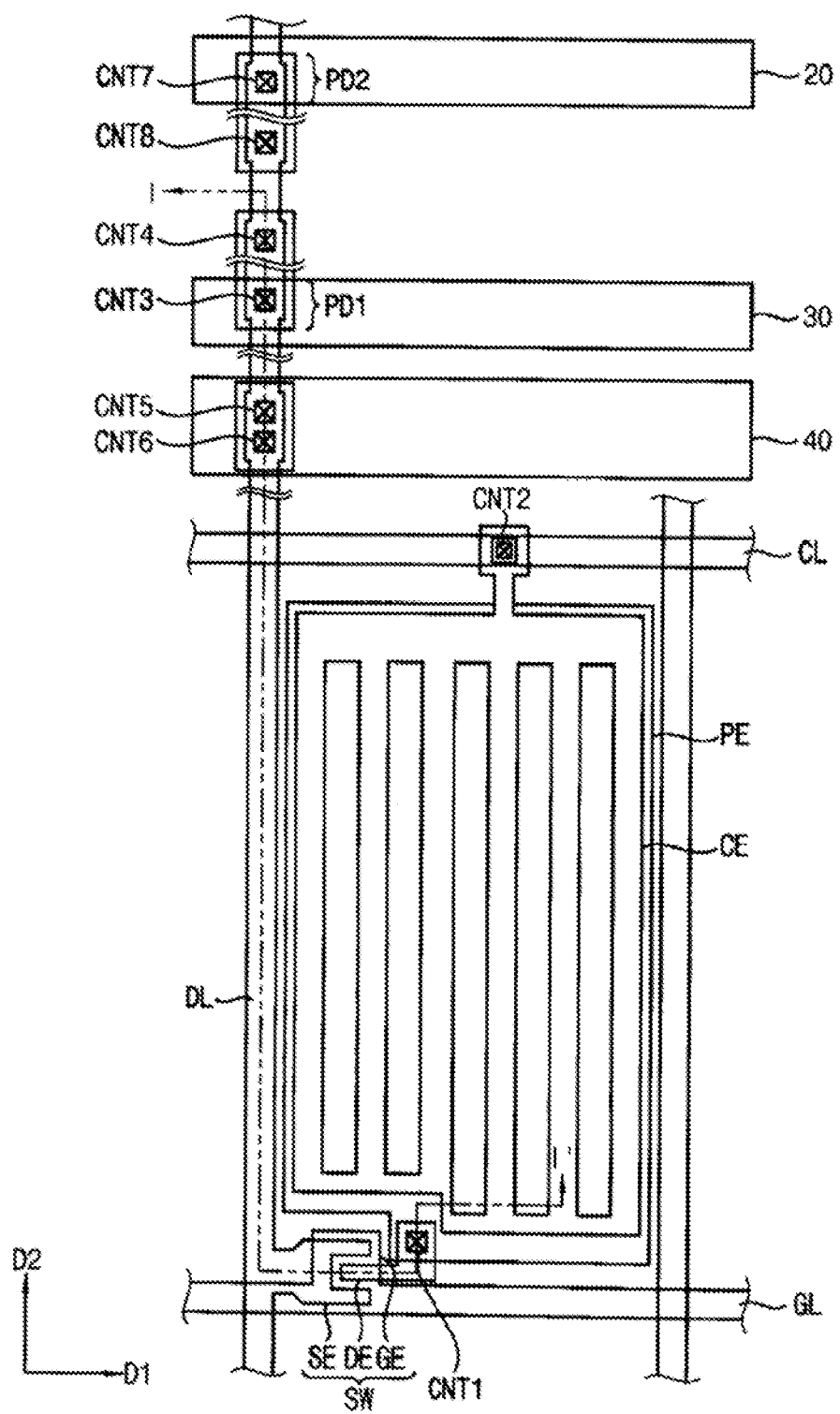
FIG. 2 is a plan view that schematically illustrates portion "A" of FIG. 1.
Figure 3:
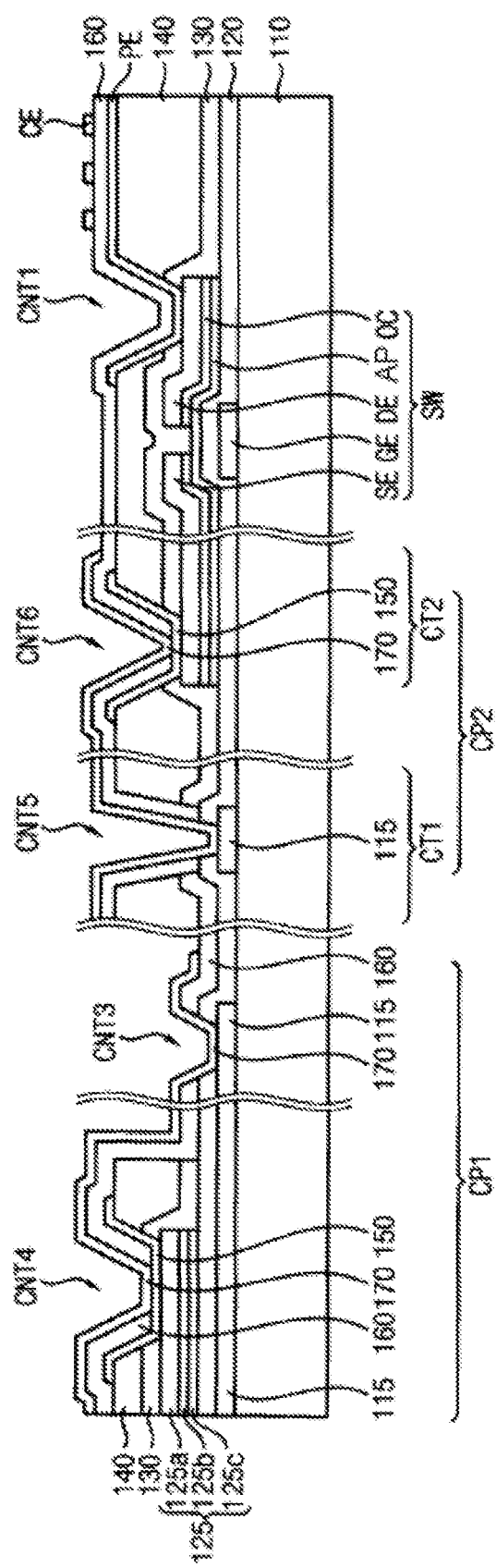
FIG. 3 is a cross-sectional view taken along the line I-I' of FIG. 2.

FIG. 1 is a plan view that illustrates a display substrate according to an exemplary embodiment of the present disclosure. FIG. 2 is a plan view that schematically illustrates portion "A" of FIG. 1. FIG. 3 is a cross-sectional view taken along the line I-I' of FIG. 2.

Referring to FIG. 1, a display substrate 10 according to an exemplary embodiment of the present disclosure includes a display area DA and a peripheral area PA surrounding the display area DA.

The display area DA includes a plurality of data lines DL, a plurality of gate lines GL, a plurality of switching elements SW and a plurality of pixel electrodes PE. The data lines DL are spaced apart in a first direction D1 and extend in a second direction D2 perpendicular to the first direction D1. The gate lines GL are spaced apart in the second direction D2 and extend in the first direction D1. Each of the switching elements SW is electrically connected to a gate line GL and a data line DL. Each of the pixel electrodes PE is electrically connected to the switching element SW.

A flexible pad part 20, circuit mounted parts 30 and a common voltage line connecting part 40 are disposed in the peripheral area PA. Moreover, a gate driving circuit 50 is further disposed in the peripheral area PA, which is connected to the gate lines to sequentially provide a gate signal to the gate lines.

The flexible pad part 20 includes a plurality of driving pads electrically connected to terminals of flexible printed circuit boards. The driving pads receive drive signals for driving the display substrate 10. For example, the driving pads receive data driving signals for driving a driving integrated circuit ("IC") mounted on the circuit mounted part 30, and gate driving signals for driving the gate driving circuit 50. The data driving signal may include analog power signals AVDD and AVSS, logic power signals DVDD and DVSS, a data signal, a clock signal, a gamma signal, a carry signal, etc. The gate driving signal may include a gate clock signal, a gate power signal VOFF, etc.

The circuit mounted part 30 includes the driving ICs mounted thereon. The circuit mounted part 30 includes input and output pads. The input and output pads are connected to input terminal and output terminals of the driving IC through a conductive adhesive member. The input and output pads include an output pad connected to an input terminal of the driving IC to output the drive signal for driving the driving IC and an input pad connected to an output terminal of the driving IC to receive an output signal of the driving IC.

The common voltage line connecting part 40 connects a line that extends from the circuit mounted part 30 with a data line DL of the display area DA.

Referring to FIGS. 2 and 3, the display substrate 10 includes a base substrate 110, a gate electrode GE, source electrode SE, a drain electrode DE, a semiconductor layer AP, an ohmic contact layer OC, a gate insulation layer 120, a first passivation layer 130, an organic layer 140, a pixel electrode PE, a second passivation layer 160, a common electrode CE, a first pad part PD1, a second pad part PD2, a first line connecting part CP1 and a second line connecting part CP2. The gate electrode GE, source electrode SE, drain electrode DE, semiconductor layer AP, and ohmic contact layer OC comprise the switching element SW.

Examples of the base substrate 110 may include a glass substrate, a quartz substrate, a silicon substrate, a plastic substrate, etc.

The gate electrode GE is disposed on the base substrate 110. The gate electrode GE may have a single layer structure that may include copper (Cu), silver (Ag), chrome (Cr), molybdenum (Mo), aluminum (Al), titanium (Ti), manganese (Mn) or a mixture thereof. Alternatively, the gate electrode GE may have a multi layer structure that includes a plurality of layers formed from different materials. For example, the gate electrode GE may include an upper layer of copper and a lower layer of titanium layer.

The gate insulation layer 120 is disposed on the gate electrode GE. The gate insulation layer 120 may cover the base substrate 110 and a first conductive pattern that includes the gate electrode GE. The gate insulation layer 120 may include an inorganic material such as silicon oxide (SiOx) or silicon nitride (SiNx). For example, the gate insulation layer 120 may include silicon oxide (SiOx), and may have a thickness of about 500 Å. In addition, the gate insulation layer 120 may include a plurality of layers formed from different materials.

An active pattern is disposed on the gate insulation layer 120. The active pattern is disposed on the gate insulation layer 120 in an area in which the gate electrode GE is disposed. The active pattern may overlap the gate electrode GE. The active pattern may partially overlap the source electrode SE and the drain electrode DE. The active pattern may be disposed between the gate electrode GE and the source electrode SE. The active pattern may be disposed between the gate electrode GE and the drain electrode DE.

The active pattern may include the semiconductor layer AP and the ohmic contact layer OC. The ohmic contact layer OC is disposed on the semiconductor layer AP. The semiconductor layer AP may include a silicon semiconductor material. For example, the semiconductor layer AP may include amorphous silicon (a-Si:H). The ohmic contact layer OC may be interposed between the semiconductor layer AP and the source electrode SE, and may be interposed between the semiconductor layer AP and the drain electrode DE. The ohmic contact layer OC may include n+ amorphous silicon (n+a-Si:H).

The source electrode SE and the drain electrode DE may be disposed on the active pattern. The source electrode SE and the drain electrode DE may be spaced apart from each other.

The source electrode SE and the drain electrode DE may have a single layer structure that may include copper (Cu), silver (Ag), chrome (Cr), molybdenum Mo), aluminum (Al), titanium (Ti), manganese (Mn) or a mixture thereof. Alternatively, the source electrode SE and the drain electrode DE may have a multi layer structure having a plurality of layers formed from different materials. For example, the source electrode SE and the drain electrode DE may include a copper layer and a titanium layer disposed on or under the copper layer.

The first passivation layer 130 may be disposed on the source electrode SE and the drain electrode DE. The first passivation layer 130 may be formed from a material that may include silicon oxide (SiOx) or silicon nitride (SiNx).

The organic layer 140 is disposed on the first passivation layer 130. The organic layer 140 may expose the flexible pad part 20 and the circuit mounted part 30. Thus, a data metal pattern comprised of the flexible pad part 20 and the circuit mounted part 30 in a region exposed by the organic layer could be damaged in manufacturing processes.

The pixel electrode PE is disposed on the organic layer 140. The pixel electrode PE may include a transparent conductive material, such as indium tin oxide (ITO) and indium zinc oxide (IZO). In addition, the pixel electrode PE may include titanium (Ti) or molybdenum titanium (MoTi). The pixel electrode PE may be electrically connected to the drain electrode DE. The pixel electrode PE may be electrically connected to the drain electrode DE through a first contact hole CNT1.

The second passivation layer 160 may be disposed on the pixel electrode PE. The second passivation layer 160 may be formed from a material that includes silicon oxide (SiOx) or silicon nitride (SiNx).

The common electrode CE may be disposed on the second passivation layer 160. The common electrode CE may overlap the pixel electrode PE. The common electrode CE may include a transparent conductive material such as indium tin oxide (ITO) and indium zinc oxide (IZO). In addition, the common electrode CE may include titanium (Ti) or molybdenum titanium (MoTi). The common electrode CE may be electrically connected to a common line CL. The common electrode CE may be supplied with a common voltage from the common line CL. The common electrode CE may be electrically connected to the common line CL through a second contact hole CNT2.

The first pad part PD1 may include a first conductive pattern 115, the gate insulation layer 120, the second passivation layer 160 and a fourth conductive pattern 170. The first pad part PD1 may be disposed in the circuit mounted pan 30. The first pad part PD1 may be connected to the input terminal and output terminal of the driving IC through a conductive adhesive member. The driving IC is connected to the circuit mounted part 30. To improve a connection between the driving IC and the first pad part PD1, the organic layer 140 may be entirely removed from the circuit mounted part 30.

The gate insulation layer 120 is disposed on the first conductive pattern 115. The second passivation layer 160 is disposed on the gate insulation layer 120. The gate insulation layer 120 and the second passivation layer 160 are partially removed to form a third contact hole CNT3 that partially exposes the first conductive pattern 115. The fourth conductive pattern 170 is disposed on the partially exposed first conductive pattern 115. Thus, the fourth conductive pattern 170 may be connected to the first conductive pattern 115 through the third contact hole CNT3.

The fourth conductive pattern 170 may be formed from the same layer as the common electrode CE. The fourth conductive pattern 170 may include a transparent conductive material, such as indium tin oxide (ITO) and indium zinc oxide (IZO). In addition, the fourth conductive pattern 170 may include titanium (Ti) or molybdenum titanium (MoTi).

The first line connecting part CP1 includes the first conductive pattern 115, the gate insulation layer 120, a second conductive pattern 125, the first passivation layer 130, the organic layer 140, a third conductive pattern 150, the second passivation layer 160 and a fourth conductive pattern 170.

The third conductive pattern 150 may be formed from the same layer as the pixel electrode PE. The third conductive pattern 150 may include a transparent conductive material, such as indium tin oxide (ITO), indium zinc oxide (IZO), etc. In addition, the third conductive pattern 150 may include titanium (Ti) or molybdenum titanium (MoTi). The third conductive pattern 150 covers the second conductive pattern 125.

The second conductive pattern 125 includes a data metal layer 125a, a semiconductor layer 125b and an ohmic contact layer 125c. When the first passivation layer 130 and the organic layer 140 are removed to form a contact hole, the second conductive pattern 125 may be partially exposed. Thus, the partially exposed second conductive pattern 125 could be damaged in subsequent processes. However, the third conductive pattern 150 covers the second conductive pattern 125, which may prevent damage to the partially exposed second conductive pattern 125.

The second conductive pattern 125 may be connected to the first pad part PD1 by the third conductive pattern 150 and the fourth conductive pattern 170. The fourth conductive pattern 170 may be electrically connected to the first conductive pattern 115 through the third contact hole CNT3. The fourth conductive pattern 170 may be electrically connected to the third conductive pattern 150 and the second conductive pattern 125 through a fourth contact hole CNT4. Thus, the fourth conductive pattern 170 may electrically connect the first conductive pattern 115 of the first pad part PD1 and the second conductive pattern 125 of the first line connecting part CP1.

The second line connecting part CP2 includes a first contact part CT1, a second contact part CT2 and the fourth conductive pattern 170. The fourth conductive pattern 170 may connect the first contact part CT1 and the second contact part CT2.

The first contact part CT1 includes the first conductive pattern 115, the gate insulation layer 120, the first passivation layer 130, the organic layer 140, the second passivation layer 160 and a fourth conductive pattern 170. The first contact part CT1 is disposed in the common voltage line connecting part 40. The gate insulation layer 120, the first passivation layer 130, the organic layer 140 and the second passivation layer 160 are partially removed to form a fifth contact hole CNT5, thus partially exposing the first conductive pattern 115. The fourth conductive pattern 170 is disposed on the partially exposed first conductive pattern 115. Thus, the fourth conductive pattern 170 may be connected to the first conductive pattern 115 through the fifth contact hole CNT5.

The second contact part CT2 includes the gate insulation layer 120, the second conductive pattern 125, the first passivation layer 130, the organic layer 140, a third conductive pattern 150, the second passivation layer 160 and a fourth conductive pattern 170.

The second conductive pattern 125 may be connected to the first contact part CT1 by the third conductive pattern 150 and the fourth conductive pattern 170. The fourth conductive pattern 170 may be electrically connected to the first conductive pattern 115 through the fifth contact hole CNT5. The fourth conductive pattern 170 may be electrically connected to the third conductive pattern 150 and the second conductive pattern 125 through a sixth contact hole CNT6. Thus, the fourth conductive pattern 170 may electrically connect the first conductive pattern 115 of the first contact part CT1 and the second conductive pattern 125 of second contact part CT2.

The second pad part PD2 is disposed in the flexible pad part 20. The fourth conductive pattern 170 may be connected to the first conductive pattern 115 through a seventh contact hole CNT7. The fourth conductive pattern 170 may be connected to the second conductive pattern 125 through an eighth contact hole CNT8. The second pad part PD2 may have the same components as the first pad part PD1. Thus, a repeated explanation will be omitted.

FIGS. 4 to 12 are cross-sectional views illustrating a method of manufacturing the display substrate of FIG. 3.

Figure 4:
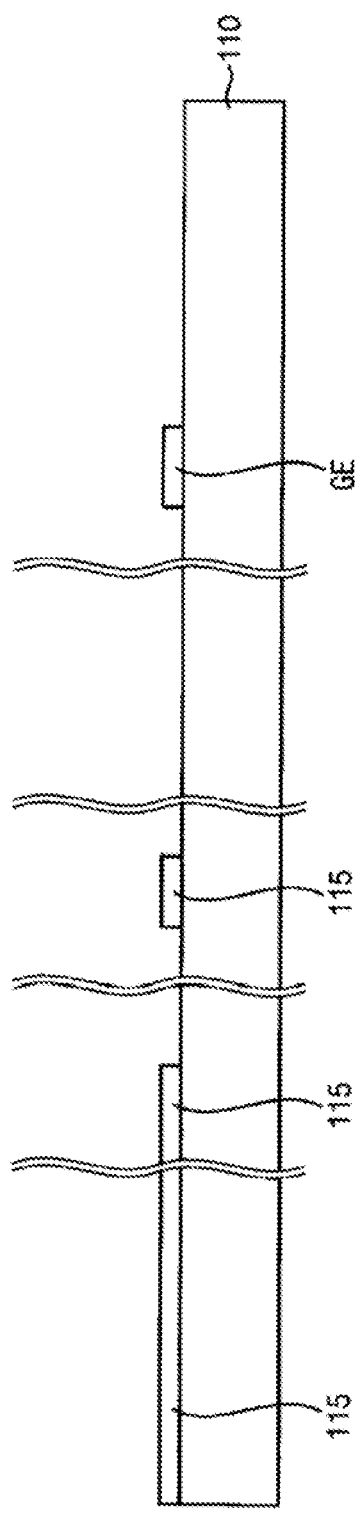
FIGS. 4 to 12 are cross-sectional views that illustrate a method of manufacturing the display substrate of FIG. 3.

Referring to FIG. 4, a first conductive pattern 115 may be formed on a base substrate 110.

Examples of the base substrate 110 may include a glass substrate, a quartz substrate, a silicon substrate, a plastic substrate, etc.

The first conductive pattern 115 may be formed by patterning a first conductive layer. The first conductive layer is formed on the base substrate 110 and then patterned to form the first conductive pattern 115. The first conductive pattern 115 may include the gate electrode GE. The first conductive layer may be formed through a sputtering process. The first conductive layer may have a single layer structure including copper (Cu), silver (Ag), chrome (Cr), molybdenum (Mo), aluminum (Al), titanium (Ti), manganese (Mn) or a mixture thereof. Alternatively, the first conductive layer may have a multi layer structure having a plurality of layers formed from different materials. The first conductive layer may be a gate metal layer. In addition, the first conductive layer may be a gate metal pattern.

Figure 5:
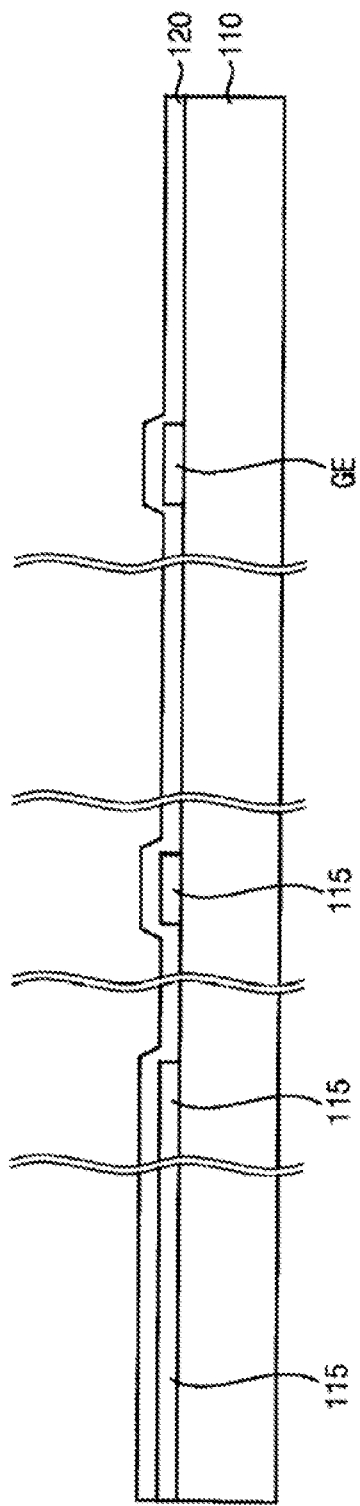

Referring to FIG. 5, a gate insulation layer 120 may be formed on the base substrate 110 on which the gate electrode GE and the first conductive pattern 115 are formed. The gate insulation layer 120 may include an inorganic material such as silicon oxide (SiOx) or silicon nitride (SiNx).

Figure 6:
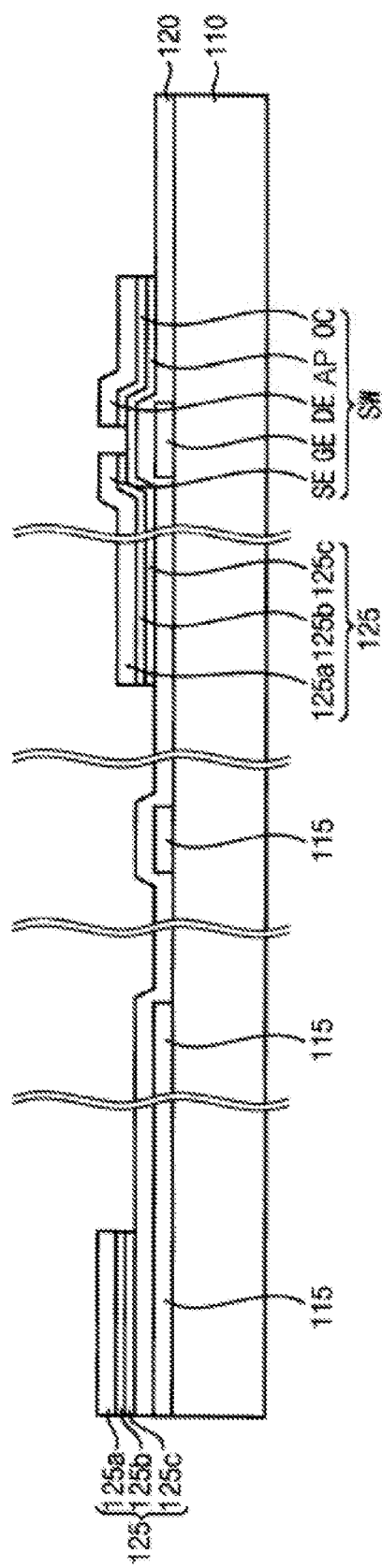

Referring to FIG. 6, a second conductive pattern 125 may be formed on the base substrate 110 on which the gate insulation layer 120 is formed. The second conductive pattern 125 may be formed by patterning a second conductive layer. A second conductive layer is formed on the gate insulation layer 120 and then patterned to form the second conductive pattern 125. The second conductive pattern 125 may include a data metal layer 125a, a semiconductor layer 125b and an ohmic contact layer 125c.

The data metal layer 125a may be the source electrode SE and the drain electrode DE in the display area DA. The semiconductor layer 125b may include amorphous silicon (a-Si:H). The semiconductor layer 125h may be interposed between the ohmic contact layer 125c and the source electrode SE, and may be interposed between the ohmic contact layer 125c and the drain electrode DE. The ohmic contact layer 125c may include n+ amorphous silicon (n+a-Si:H).

Figure 7:
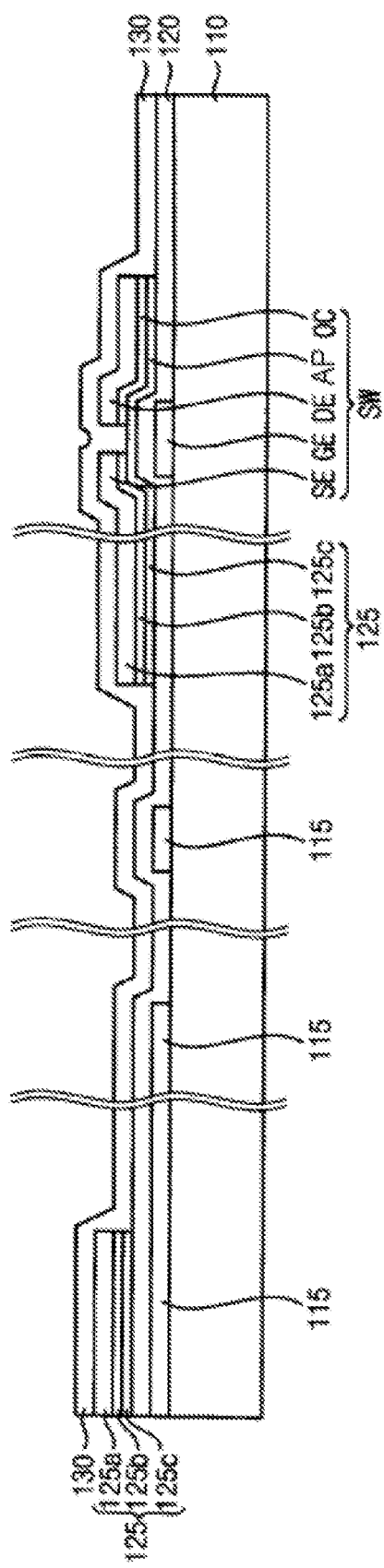

Referring to FIG. 7, a first passivation layer 130 may be formed on the base substrate 110 on which the second conductive pattern 125 is formed. The first passivation layer 130 may include the same material as the gate insulation layer 120. For example, the first passivation layer 130 may include an inorganic material such as silicon oxide (SiOx) or silicon nitride (SiNx).

Figure 8:
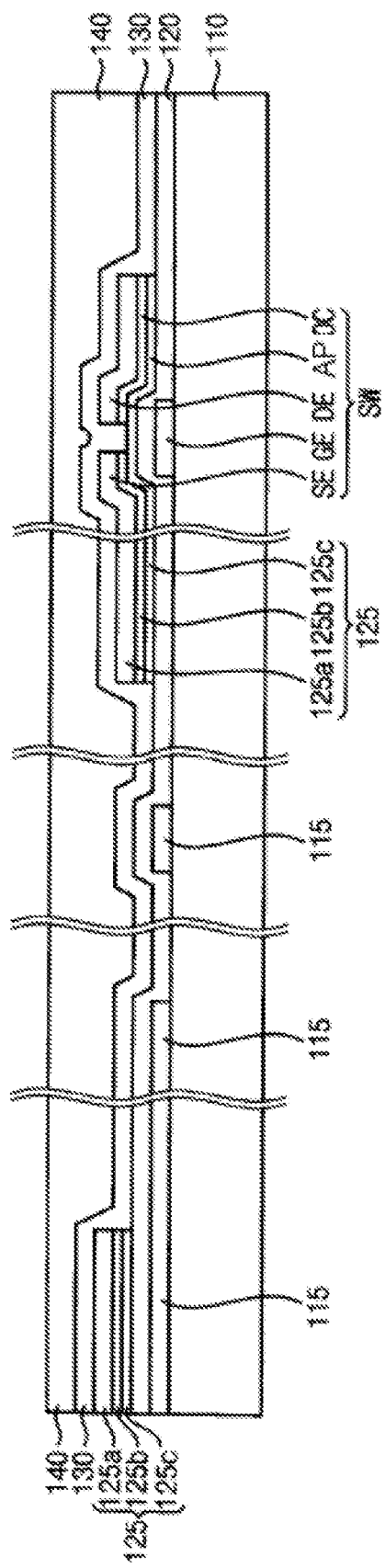

Referring to FIG. 8, an organic layer 140 may be formed on the base substrate 110 on which the first passivation layer 130 is formed. The organic layer 140 planarizes an upper surface of the display substrate 10, to prevent manufacturing artifacts such as a signal line disconnections from occurring.

Figure 9:
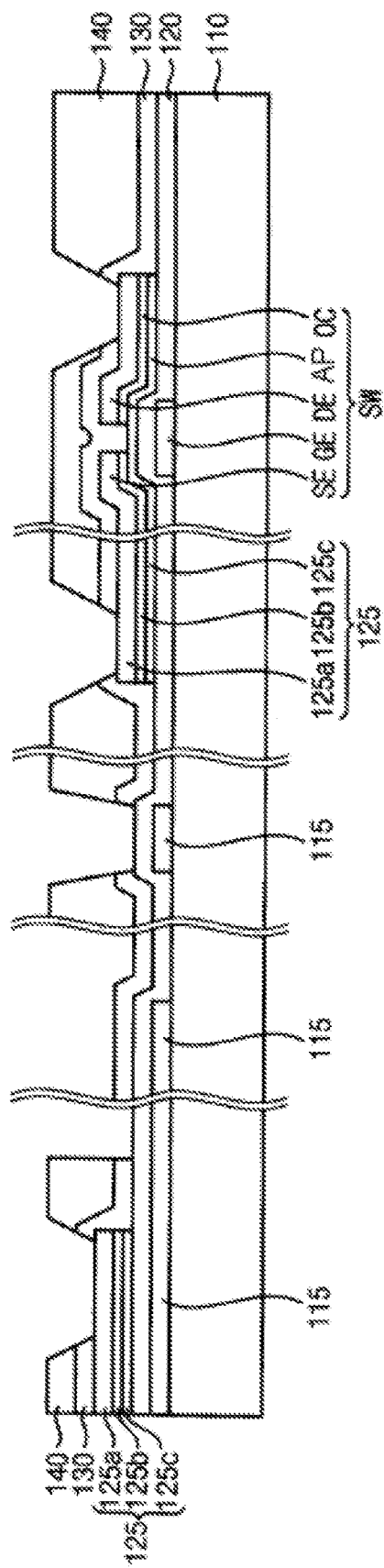

Referring to FIG. 9, the first passivation layer 130 and the organic layer 140 may be patterned. Thus, the drain electrode DE may be partially exposed in the display area DA. The second conductive pattern 125 may be partially exposed in a first line connecting part CP1 and a second line connecting part CP2 in the peripheral area PA. The partially exposed drain electrode DE may be connected to the pixel electrode PE in a subsequent process. However, the partially exposed second conductive pattern 125 could be damaged in subsequent processes.

Figure 10:
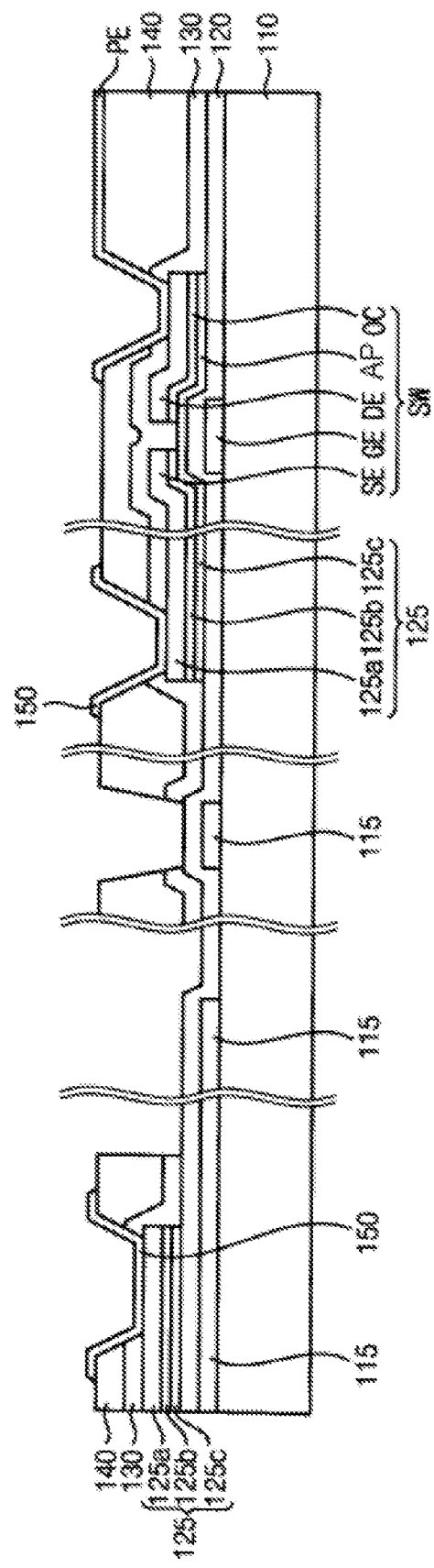

Referring to FIG. 10, a third conductive pattern 150 may be formed on the patterned first passivation layer 130 and the patterned organic layer 140. The third conductive pattern 150 may be the pixel electrode PE connected to the drain electrode DE in the display area DA. The pixel electrode PE may include a transparent conductive material, such as indium tin oxide (ITO), indium zinc oxide (IZO), etc. In addition, the pixel electrode PE may include titanium (Ti) or molybdenum titanium (MoTi).

The third conductive pattern 150 may cover the partially exposed second conductive pattern 125 in the peripheral area PA. The partially exposed second conductive pattern 125 could be damaged in subsequent processes. However, the third conductive pattern 150 covers the second conductive pattern 125, to prevent damage to the partially exposed second conductive pattern 125. The third conductive pattern 150 may be formed in the same layer as the pixel electrode PE. The third conductive pattern 150 may include the same material as the pixel electrode PE.

Figure 11:
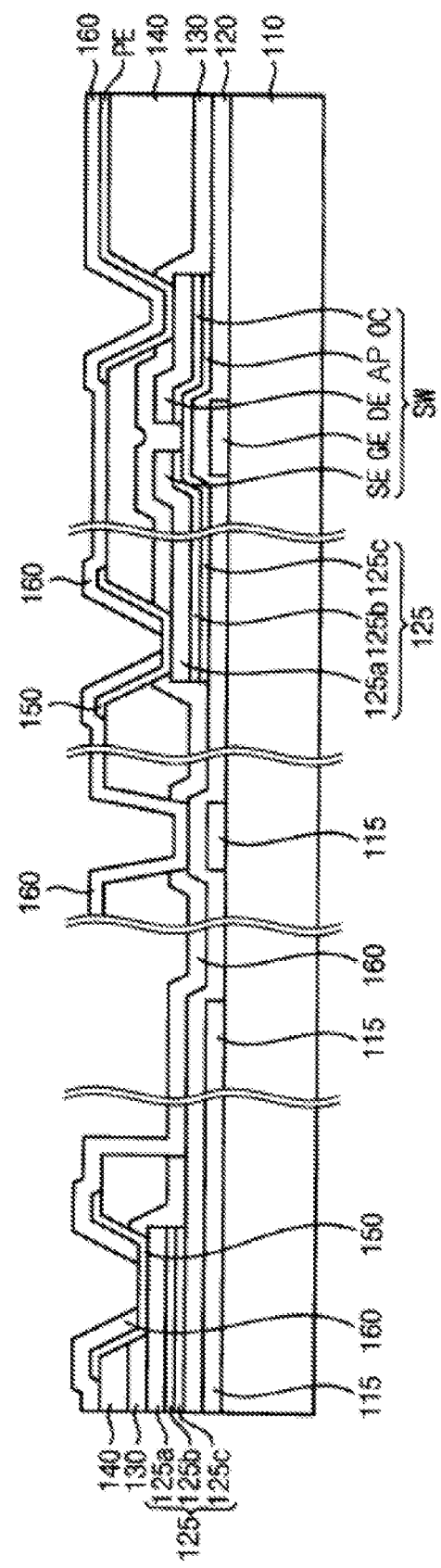

Referring to FIG. 11, a second passivation layer 160 may be formed on the base substrate 110 on which the third conductive pattern 150 is formed. The second passivation layer 160 may include the same material as the first passivation layer 130. For example, the second passivation layer 160 may include an inorganic material such as silicon oxide (SiOx) or silicon nitride (SiNx).

Figure 12:
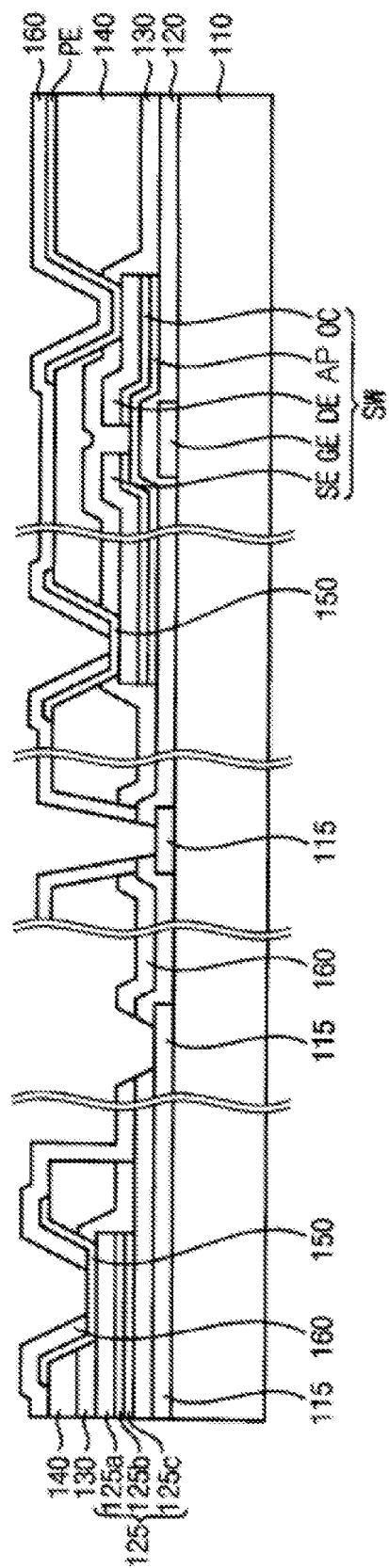

Referring to FIG. 12, the gate insulation layer 120 and the second passivation layer 160 may be patterned. Thus, the first conductive pattern 115 of the first pad part PD1 and the first conductive pattern 115 of the second line connecting part CP2 may be partially exposed. The third conductive pattern 150, which covers the second conductive pattern 125 in the fourth contact hole CNT4 and the sixth contact hole CNT6, may be partially exposed in the fourth contact hole CNT4 and the sixth contact hole CNT6.

Referring again to FIG. 3, a fourth conductive pattern 170 may be formed on the base substrate 110 on which the first conductive pattern 115 and the third conductive pattern 150 are partially exposed. The fourth conductive pattern 170 may be formed by patterning a fourth conductive layer.

The fourth conductive pattern 170 may be the common electrode CE. The common electrode CE may overlap the pixel electrode PE. The common electrode CE may include a transparent conductive material, such as indium tin oxide (ITO), indium zinc oxide (IZO), etc. In addition, the common electrode CE may include titanium (Ti) or molybdenum titanium (MoTi). The common electrode CE may be electrically connected to the common line CL through the second contact hole CNT2. The common electrode CE may be supplied with a common voltage from the common line CL.

The fourth conductive pattern 170 may electrically connect the first conductive pattern 115 and the second conductive pattern 125 in the peripheral area PA. For example, the fourth conductive pattern 170 may be electrically connected to the first conductive pattern 115 through the third contact hole CNT3. The fourth conductive pattern 170 may be electrically connected to the third conductive pattern 150 covering the second conductive pattern 125 through the fourth contact hole CNT4. Thus, the fourth conductive pattern 170 may electrically connect the first conductive pattern 115 of the first pad part PD1 and the second conductive pattern 125 of the first line connecting part CP1.

The third conductive pattern 150 may be exposed in the fourth contact hole CNT4 of the first line connecting part CP1. Thus, the fourth conductive pattern 170 may be electrically connected to the third conductive pattern 150. In addition, the third conductive pattern 150 and the second conductive pattern 125 are electrically connected to each other. Thus, the fourth conductive pattern 170 may be electrically connected to the second conductive pattern 125.

In the second line connecting part CP2, the fourth conductive pattern 170 may be electrically connected to the first conductive pattern 115 through the fifth contact hole CNT5. The fourth conductive pattern 170 may be electrically connected to the second conductive pattern 125 through the sixth contact hole CNT6. Thus, the fourth conductive pattern 170 may electrically connect the first conductive pattern 115 of the first pad part PD1 and the second conductive pattern 125 of the second line connecting part CP2 through the fifth contact hole CNT5 and the sixth contact hole CNT6.

The third conductive pattern 150 covering the second conductive pattern 125 may be exposed in the sixth contact hole CNT6 of the second line connecting part CP2. Thus, the fourth conductive pattern 170 may be electrically connected to the third conductive pattern 150. In addition, the third conductive pattern 150 and the second conductive pattern 125 are electrically connected to each other. Thus, the fourth conductive pattern 170 may be electrically connected to the second conductive pattern 125.

According to a present exemplary embodiment, pads of the flexible pad part 20 and the circuit mounted parts 30 are formed with the first conductive pattern 115, and the third conductive pattern 150 covers the partially exposed second conductive pattern 125. Thus, damage to the second conductive pattern 125 may be prevented in subsequent processes.

Figure 13:
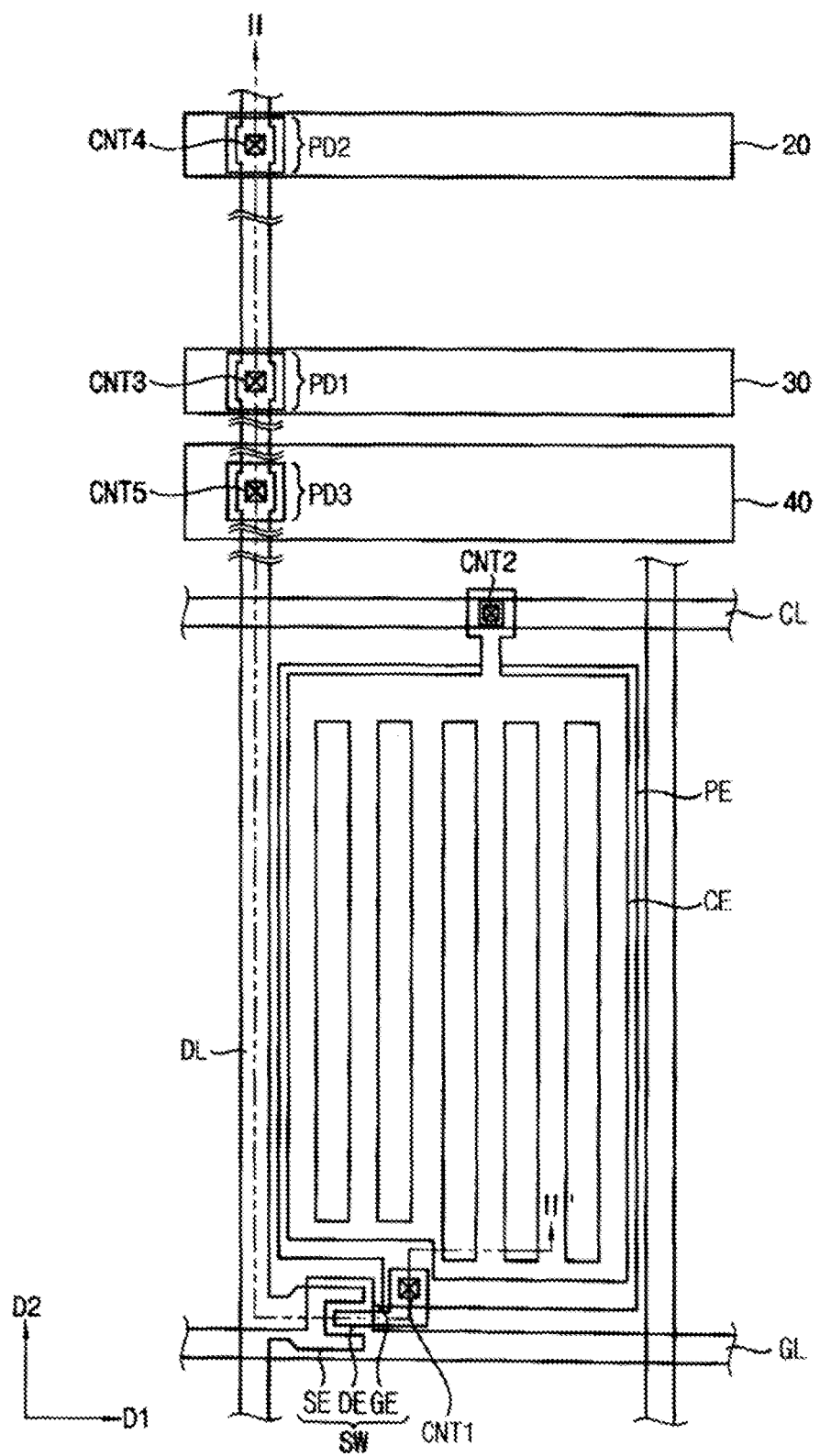
FIG. 13 is a plan view that illustrates a display substrate according to an exemplary embodiment of the present disclosure.
Figure 14:
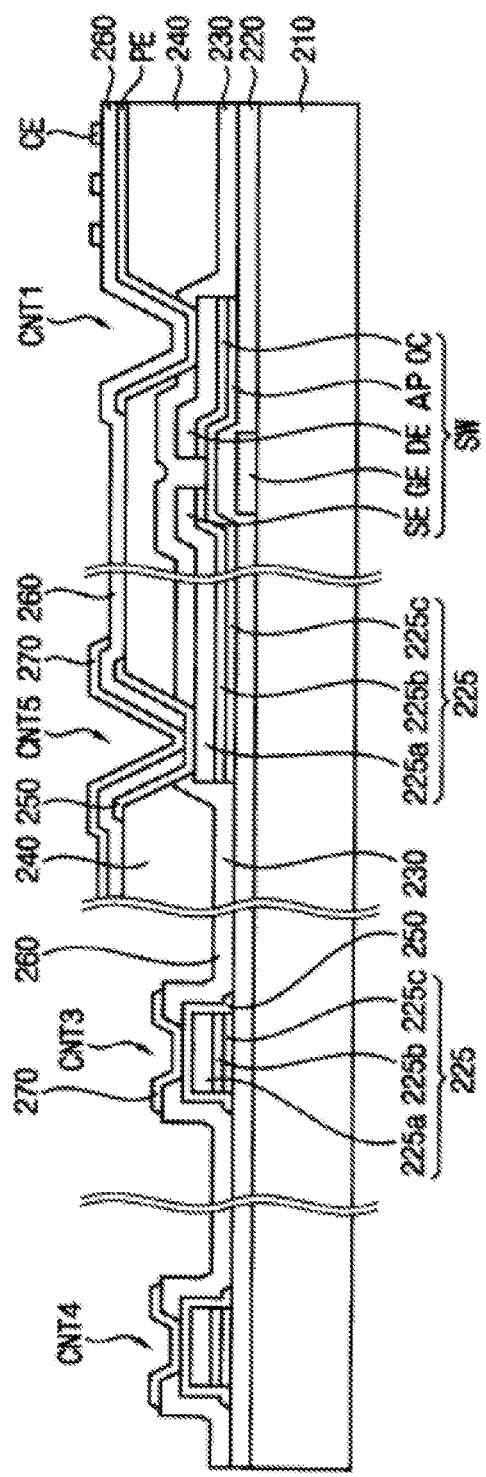
FIG. 14 is a cross-sectional view taken along the line II-II' of FIG. 13.

FIG. 13 is a plan view that illustrates a display substrate according to an exemplary embodiment of the present disclosure. FIG. 14 is a cross-sectional view taken along the line II-II' of FIG. 13.

Referring to FIGS. 13 and 14, the display substrate 10 includes a base substrate 210, a gate electrode GE, source electrode SE, a drain electrode DE, a semiconductor layer AP, an ohmic contact layer OC a gate insulation layer 220, a first passivation layer 230, an organic layer 240, a pixel electrode PE, a second passivation layer 260, a common electrode CE, a first pad part PD1, a second pad part PD2 and a third pad part PD3. The gate electrode GE, source electrode SE, drain electrode DE, semiconductor layer AP, and ohmic contact layer OC comprise the switching element SW.

Examples of the base substrate 210 may include a glass substrate, a quartz substrate, a silicon substrate, a plastic substrate, etc.

The gate electrode GE is disposed on the base substrate 210. The gate electrode GE may have a single layer structure that includes copper (Cu), silver (Ag), chrome (Cr), molybdenum (Mo), aluminum (Al), titanium (Ti), manganese (Mn), or a mixture thereof. Alternatively, the gate electrode GE may have a multi layer structure having a plurality of layers that include different materials. For example, the gate electrode GE may include a copper layer and a titanium layer disposed on or under the copper layer.

The gate insulation layer 220 is disposed on the gate electrode GE. The gate insulation layer 220 may cover the base substrate 210 and a first conductive pattern that includes the gate electrode GE. The gate insulation layer 220 may include an inorganic material such as silicon oxide (SiOx) or silicon nitride (SiNx). For example, the gate insulation layer 220 may includes silicon oxide (SiOx), and may have thickness about 500 Å. In addition, the gate insulation layer 220 may include a plurality of layers formed from different materials.

An active pattern is disposed on the gate insulation layer 220. The active pattern is disposed on the gate insulation layer 220 in an area in which the gate electrode GE is disposed. The active pattern may overlap the gate electrode GE. The active pattern may partially overlap the source electrode SE and the drain electrode DE. The active pattern may be disposed between the gate electrode GE and the source electrode SE. The active pattern may be disposed between the gate electrode GE and the drain electrode DE.

The active pattern may include the semiconductor layer AP and the ohmic contact layer OC. The ohmic contact layer OC is disposed on the semiconductor layer AP. The semiconductor layer AP may include a silicon semiconductor material. For example, the semiconductor layer AP may include amorphous silicon (a-Si:H). The ohmic contact layer OC may be interposed between the semiconductor layer AP and the source electrode SE, and may be interposed between the semiconductor layer AP and the drain electrode DE. The ohmic contact layer OC may include n+ amorphous silicon (n+a-Si:H).

The source electrode SE and the drain electrode DE may be disposed on the active pattern. The source electrode SE and the drain electrode DE may be spaced apart from each other.

The source electrode SE and the drain electrode DE may have a single layer structure that may include copper (Cu), silver (Ag), chrome (Cr), molybdenum (Mo), aluminum (Al), titanium (Ti), manganese (Mn) or a mixture thereof. Alternatively, the source electrode SE and the drain electrode DE may have a multi layer structure having a plurality of layers formed from different materials. For example, the source electrode SE and the drain electrode DE may include a copper layer and a titanium layer disposed on or under the copper layer.

The first passivation layer 230 may be disposed on the source electrode SE and the drain electrode DE. The first passivation layer 230 may be formed from a material that may include silicon oxide (SiOx) or silicon nitride (SiNx).

The organic layer 240 is disposed on the first passivation layer 230. The organic layer 240 may be removed from the flexible pad part 20 and the circuit mounted part 30. Thus, a data metal pattern of the flexible pad part 20 and the circuit mounted part 30 in a region exposed by the organic layer could be damaged in subsequent manufacturing processes.

The pixel electrode PE is disposed on the organic layer 140. The pixel electrode PE may include a transparent conductive material, such as indium tin oxide (ITO), indium zinc oxide (IZO), etc. In addition, the pixel electrode PE may include titanium (Ti) or molybdenum titanium (MoTi). The pixel electrode PE may be electrically connected to the drain electrode DE. The pixel electrode PE may be electrically connected to the drain electrode DE through the first contact hole CNT1.

The second passivation layer 260 may be disposed on the pixel electrode PE. The second passivation layer 260 may be formed from a material that includes silicon oxide (SiOx) or silicon nitride (SiNx).

The common electrode CE may be disposed on the second passivation layer 260. The common electrode CE may overlap the pixel electrode PE. The common electrode CE may include a transparent conductive material, such as indium tin oxide (ITO), indium zinc oxide (IZO), etc. In addition, the common electrode CE may include titanium (Ti) or molybdenum titanium (MoTi). The common electrode CE may be electrically connected to the common line CL through the second contact hole CNT2. The common electrode CE may be supplied with a common voltage from the common line CL.

The first pad part PD1 may include the gate insulation layer 220, a second conductive pattern 225, a third conductive pattern 250, the second passivation layer 260 and a fourth conductive pattern 270. The first pad part PD1 may be disposed in the circuit mounted part 30. The first pad part PD1 may be connected to the input terminal and output terminal of the driving IC through a conductive adhesive member. The driving IC is connected to the circuit mounted part 30. To improve a connection between the driving IC and the first pad part PD1, the organic layer 240 may be entirely removed from the circuit mounted part 30.

The second conductive pattern 225 is disposed on the gate insulation layer 220. The third conductive pattern 250 is disposed on the second conductive pattern 225. The second passivation layer 260 is disposed on the third conductive pattern 250. The second passivation layer 260 is partially removed to partially expose the third conductive pattern 250. The fourth conductive pattern 270 is disposed on the partially exposed third conductive pattern 250. Thus, the fourth conductive pattern 270 may be connected to the third conductive pattern 250 through the third contact hole CNT3. In addition, the third conductive pattern 250 covers the second conductive pattern 225 and is electrically connected to the second conductive pattern 225. Thus, the fourth conductive pattern 270 may be connected to the second conductive pattern 225 through the third contact hole CNT3.

The fourth conductive pattern 270 may be formed from the same layer as the common electrode CE. The fourth conductive pattern 270 may include a transparent conductive material, such as indium tin oxide (ITO), indium zinc oxide (IZO), etc. In addition, the fourth conductive pattern 270 may include titanium (Ti) or molybdenum titanium (MoTi).

The second pad part PD2 is disposed in the flexible pad part 20. The fourth conductive pattern 270 may be connected to the second conductive pattern 225 through the fourth contact hole CNT4. The second pad part PD2 may have the same components as the first pad part PD1. Thus, a repeated explanation will be omitted.

The third pad part PD3 may include the gate insulation layer 220, the second conductive pattern 225, the first passivation layer 230, the organic later 240, the third conductive pattern 250, the second passivation layer 260 and the fourth conductive pattern 270. The third pad part PD3 may be disposed in the common voltage line connecting part 40.

The second conductive pattern 225 is disposed on the gate insulation layer 220. The first passivation layer 230 is disposed on the second conductive pattern 225. The organic layer 240 is disposed on the first passivation layer 230. The first passivation layer 230 and the organic layer 240 are partially removed to partially expose the third conductive pattern 250. The fourth conductive pattern 270 is disposed on the partially exposed third conductive pattern 250. Thus, the fourth conductive pattern 270 may be connected to the third conductive pattern 250 through the fifth contact hole CNT5. In addition, the third conductive pattern 250 covers the second conductive pattern 225 and is electrically connected to the second conductive pattern 225. Thus, the fourth conductive pattern 270 may be connected to the second conductive pattern 225 through the fifth contact hole CNT5.

FIGS. 15 to 22 are cross-sectional views that illustrate a method of manufacturing the display substrate of FIG. 14.

Figure 15:
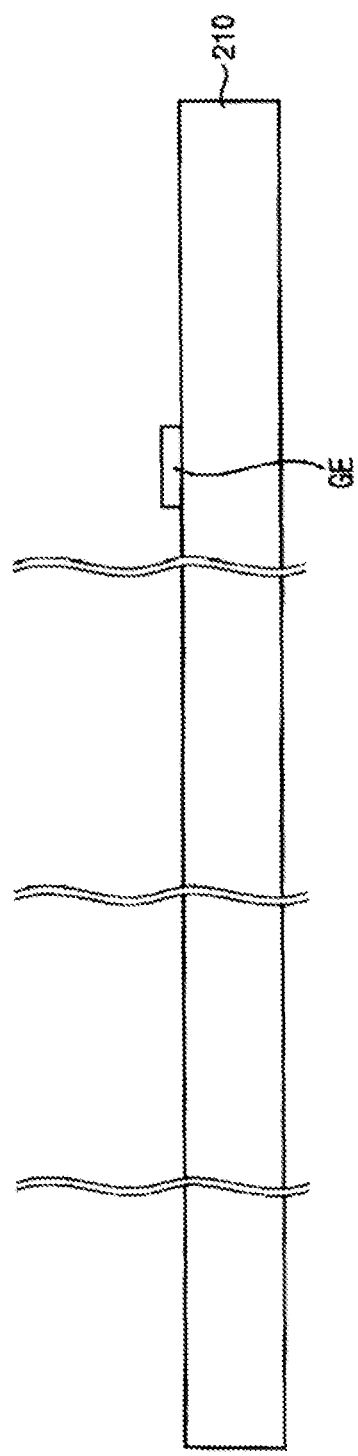
FIGS. 15 to 22 are cross-sectional views that illustrate a method of manufacturing the display substrate of FIG. 14.

Referring to FIG. 15, the gate electrode GE may be formed on the base substrate 210.

Examples of the base substrate 210 may include a glass substrate, a quartz substrate, a silicon substrate, a plastic substrate, etc. The gate electrode GE may be formed by patterning a first conductive layer. The first conductive layer may be formed through a sputtering process. The first conductive layer may have a single layer structure that may include copper (Cu), silver (Ag), chrome (Cr), molybdenum (Mo), aluminum (Al), titanium (Ti), manganese (Mn), or a mixture thereof. Alternatively, the first conductive layer may have a multi layer structure having a plurality of layers formed from different materials. The first conductive layer may be a gate metal layer.

Figure 16:
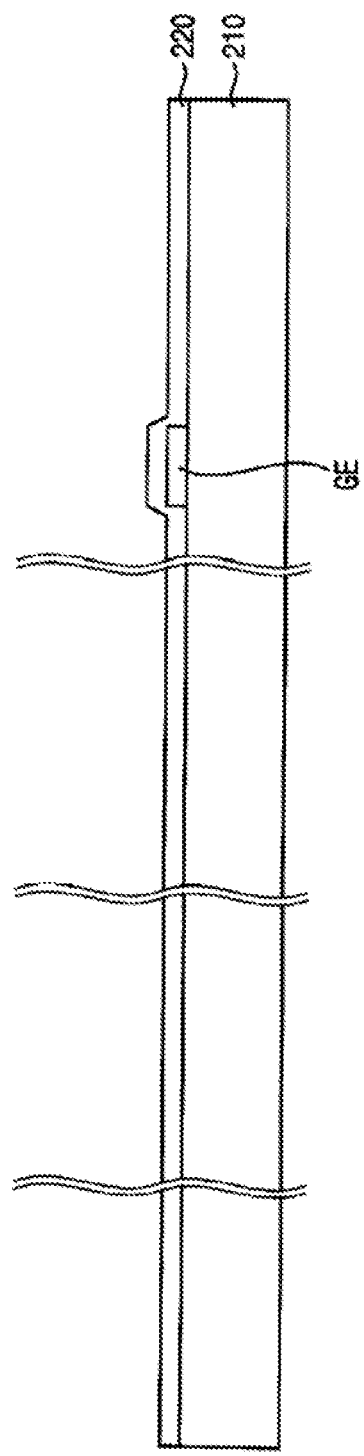

Referring to FIG. 16, the gate insulation layer 220 may be formed on the base substrate 210 on which the gate electrode GE is formed. The gate insulation layer 220 may include an inorganic material such as silicon oxide (SiOx) or silicon nitride (SiNx).

Figure 17:
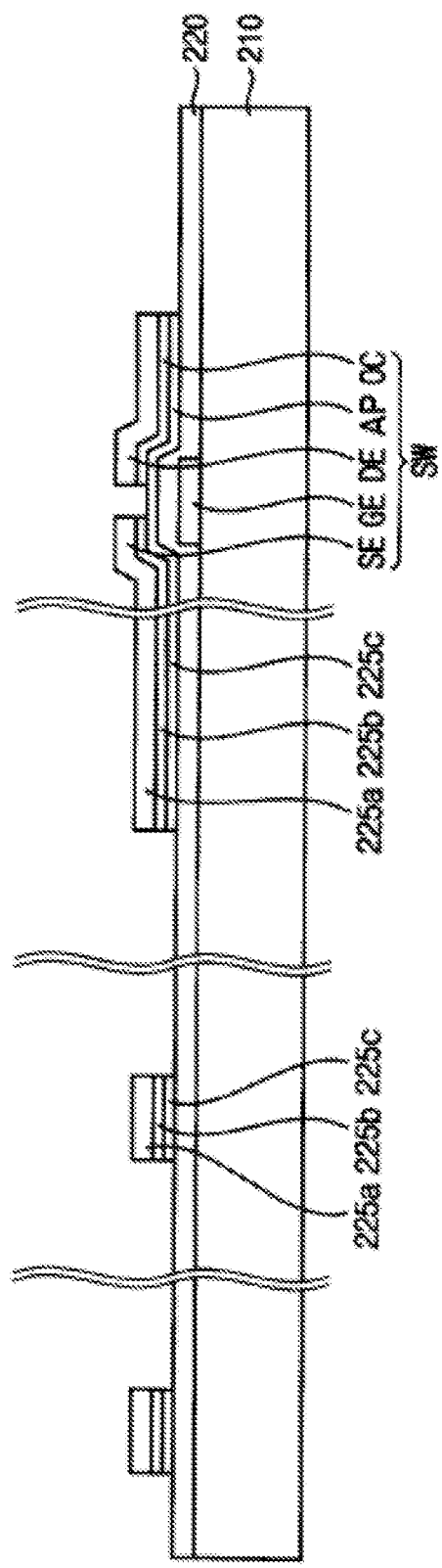

Referring to FIG. 17, the second conductive pattern 225 may be formed on the base substrate 210 on which the gate insulation layer 220 is formed. The second conductive pattern 225 may be formed by patterning the second conductive layer. The second conductive pattern 225 may include a data metal layer 225a, a semiconductor layer 225b and an ohmic contact layer 225c.

The data metal layer 225a may be the source electrode SE and the drain electrode DE is the display area DA. The semiconductor layer 225b may include amorphous silicon (a-Si:H). The semiconductor layer 225b may be interposed between the ohmic contact layer 225c and the source electrode SE, and may be interposed between the ohmic contact layer 225c and the drain electrode DE. The ohmic contact layer 225c may include n+ amorphous silicon (n+a-Si:H).

Figure 18:
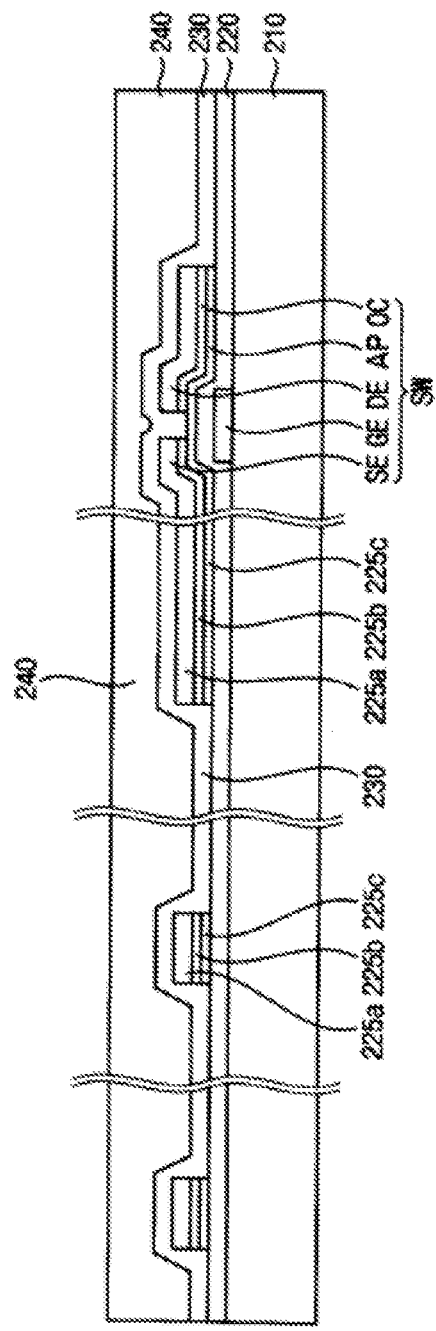

Referring to FIG. 18, the first passivation layer 230 and the organic layer 240 may be formed on the base substrate 210 on which the second conductive pattern 225 is formed. The first passivation layer 230 may include the same material as the gate insulation layer 220. For example, the first passivation layer 230 may include an inorganic material such as silicon oxide (SiOx) or silicon nitride (SiNx).

The organic layer 240 may be formed on the base substrate 210 on which the first passivation layer 230 is formed. The organic layer 240 planarizes an upper surface of the display substrate, to prevent manufacturing artifacts such as signal line disconnections.

Figure 19:
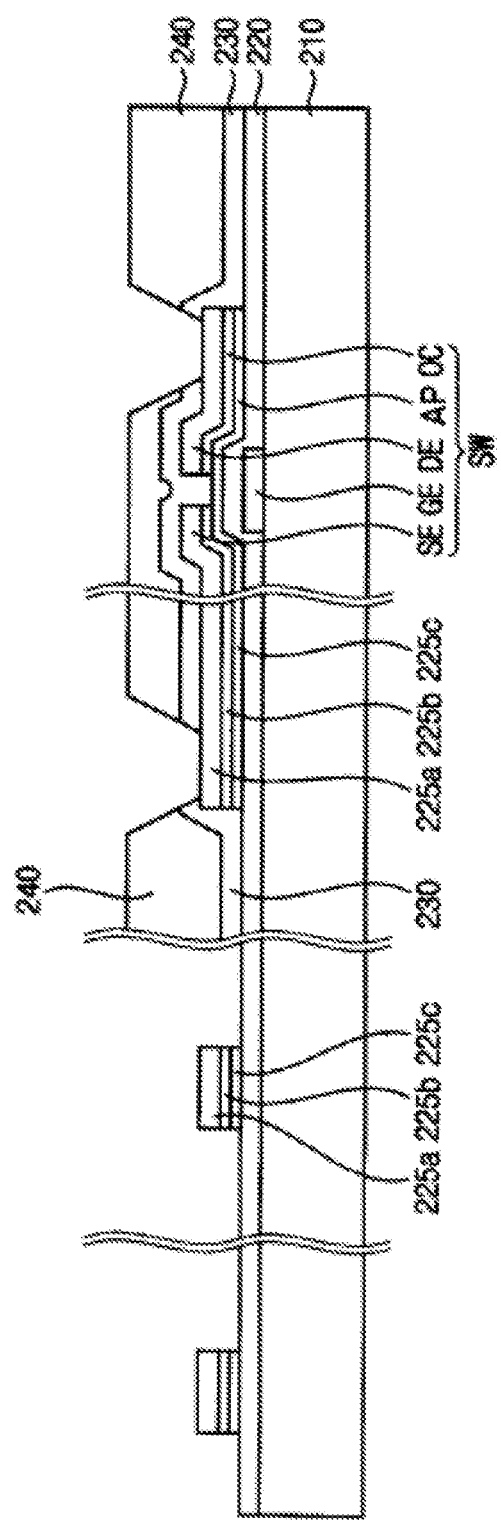

Referring to FIG. 19, the first passivation layer 230 and the organic layer 240 may be patterned. Thus, the drain electrode DE may be partially exposed in the display area DA. The second conductive pattern 225 may be partially exposed in the first pad part PD1, the second pad part PD2 and the third pad part PD3 in the peripheral area PA. The partially exposed drain electrode DE may be connected to the pixel electrode PE in a subsequent process. However, the partially exposed second conductive pattern 225 could be damaged in subsequent processes.

Figure 20:
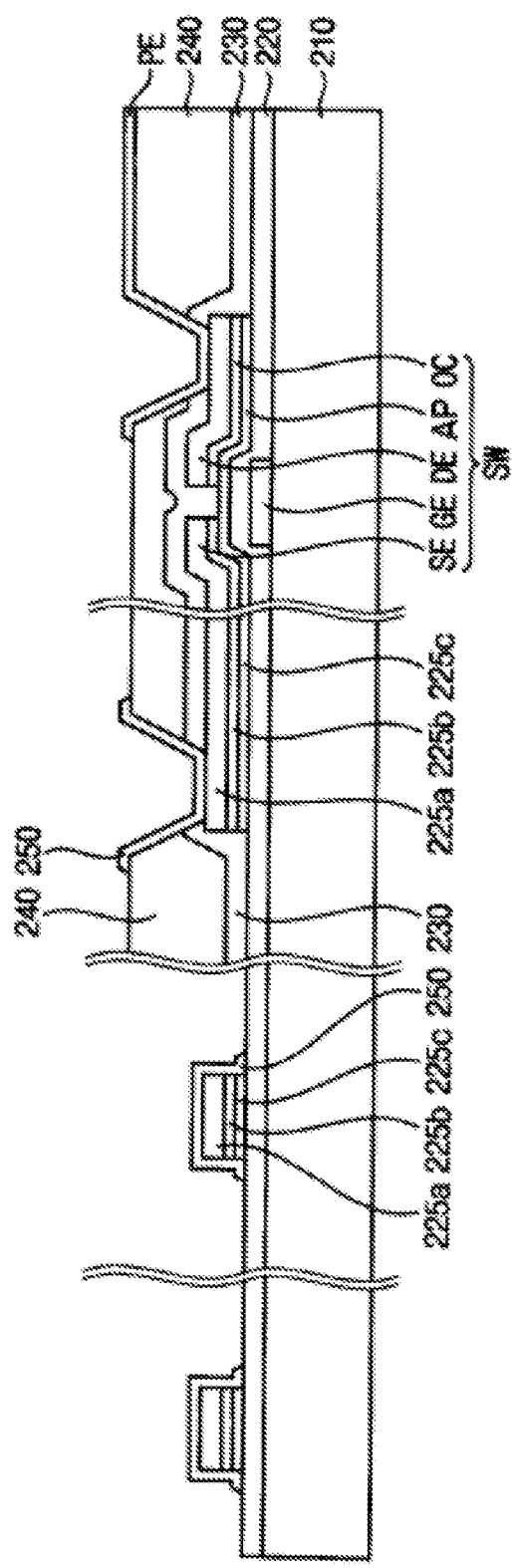

Referring to FIG. 20, the third conductive pattern 250 may be formed on the patterned first passivation layer 230 and the patterned organic layer 240. The third conductive pattern 250 may be the pixel electrode PE connected to the drain electrode DE in the display area DA. The pixel electrode PE may include a transparent conductive material, such as indium tin oxide (ITO), indium zinc oxide (IZO), etc. In addition, the pixel electrode PE may include titanium (Ti) or molybdenum titanium (MoTi).

The third conductive pattern 250 may cover the partially exposed second conductive pattern 225 in the peripheral area PA. The partially exposed second conductive pattern 225 could be damaged in subsequent processes. However, the third conductive pattern 250 covers the second conductive pattern 225, to prevent damage to the partially exposed second conductive pattern. The third conductive pattern 250 may be formed from the same layer as the pixel electrode PE. The third conductive pattern 250 may include the same material as the pixel electrode PE.

Figure 21:
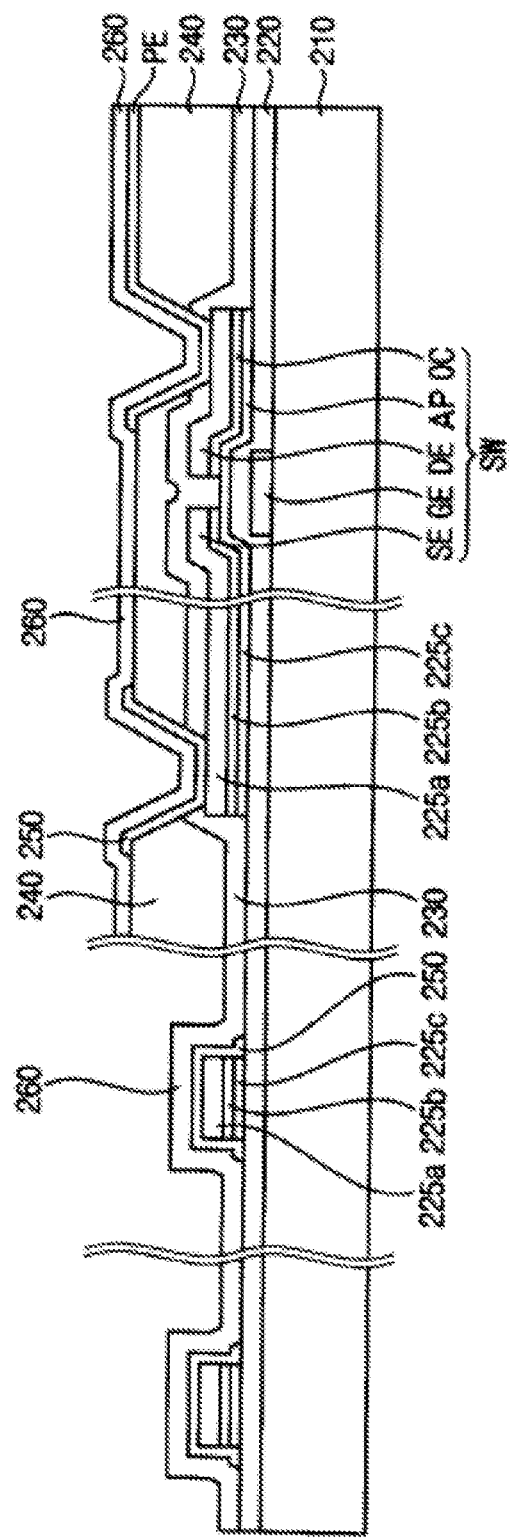

Referring to FIG. 21, the second passivation layer 260 may be formed on the base substrate 210 on which the third conductive pattern 250 is formed. The second passivation layer 260 may include the same material as the first passivation layer 230. For example, the second passivation layer 260 may include an inorganic material such as silicon oxide (SiOx) or silicon nitride (SiNx).

Figure 22:
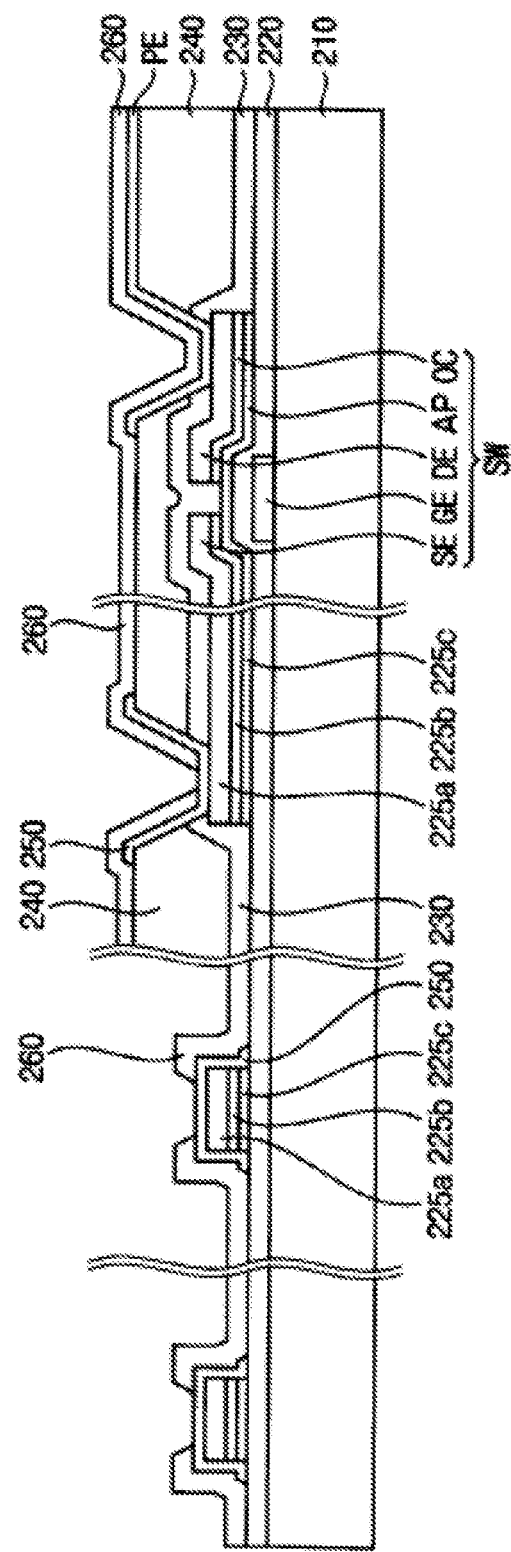

Referring to FIG. 22, the second passivation layer 260 may be patterned. Thus, the third conductive pattern 250 of the first pad part PD1, the second pad part PD2 and the third pad part PD3 may be partially exposed. The third conductive pattern 250 covers the second conductive pattern 125 in the fourth contact hole CNT4 and the sixth contact hole CNT6. Thus, the third conductive pattern 150 may be partially exposed in the third contact hole CNT4, the fourth contact hole CNT4 and the fifth contact hole CNT5.

Referring to FIG. 14, the fourth conductive pattern 270 may be formed on the base substrate 210 on which the third conductive pattern 250 is partially exposed. The fourth conductive pattern 270 may be formed by patterning a fourth conductive layer.

The fourth conductive pattern 270 may be the common electrode CE. The common electrode CE may overlap the pixel electrode PE. The common electrode CE may include a transparent conductive material, such as indium tin oxide (ITO), indium zinc oxide (IZO), etc. In addition, the common electrode CE may include titanium (Ti) or molybdenum titanium (MoTi). The common electrode CE may be electrically connected to the common line CL through the second contact hole CNT2. The common electrode CE may be supplied with a common voltage from the common line CL.

The fourth conductive pattern 270 may be electrically connected to the second conductive pattern 225 in the peripheral area PA. For example, the fourth conductive pattern 270 may be electrically connected to the third conductive pattern 250 through the third contact hole CNT3. The fourth conductive pattern 270 may be electrically connected to the third conductive pattern 250 through the fourth contact hole CNT4. The fourth conductive pattern 270 may be electrically connected to the third conductive pattern 250 through the fifth contact hole CNT5. The third conductive pattern 250 covers the second conductive pattern 225 and is electrically connected to the second conductive pattern 225. Thus, the fourth conductive pattern 270 may electrically connect the second conductive pattern 215 of the first pad part PD1, the second pad part PD2 and the third pad part PD3. According to the present exemplary embodiment, the third conductive pattern 250 covers the partially exposed second conductive pattern 225, which may prevent damage to the second conductive pattern 225 in subsequent processes.

According to an exemplary embodiment of the present disclosure, pads of the flexible pad part and the circuit mounted parts are formed with a gate metal pattern, and a conductive pattern covers the partially exposed data metal pattern. Thus, damage to the data metal pattern may be prevented in subsequent processes.

In addition, when pads of the flexible pad part and the circuit mounted parts are formed with a data metal pattern, a conductive pattern covers the partially exposed data metal pattern. Thus, damage to the data metal pattern may be prevented in subsequent processes.

The foregoing is illustrative of exemplary embodiments of the present disclosure and is not to be construed as limiting thereof. Although a few exemplary embodiments of the present disclosure have been described, those skilled in the art will readily appreciate that many modifications are possible in exemplary embodiments without materially departing from the novel teachings of the present disclosure. Accordingly, all such modifications are intended to be included within the scope of the present disclosure as defined in the following claims.

What is claimed is:

1. A display substrate comprising:
   a switching element disposed in a display region that connects with a gate line, data line and a first electrode;
   a first pad part disposed in a peripheral region adjacent to the display region that includes a first conductive pattern formed from a first conductive layer that includes a same material as the data line, a second conductive pattern that contacts the first conductive pattern, and a third conductive pattern disposed on the second conductive pattern that electrically connects to the second conductive pattern;
   a second pad part disposed in a peripheral region adjacent to the first pad part that includes the first conductive pattern, the second conductive pattern that contacts the first conductive pattern, and the third conductive pattern disposed on the second conductive pattern that electrically connects to the second conductive pattern, wherein the first pad part is located between the display region and the second pad part;
   a connecting part disposed in the peripheral region between the switching element and the first pad part that includes the first conductive pattern, an organic layer on the first conductive pattern with a contact hole that exposes the first conductive pattern, wherein the second conductive pattern is disposed on the organic layer and makes contact with the first conductive pattern through the contact hole, wherein the organic layer is spaced apart from the second pad part; and
   a second electrode disposed on the first electrode that overlaps the first electrode, wherein the third conductive pattern is formed from a same layer as the second electrode.

2. The display substrate of claim 1, wherein the switching element comprises:
   a source electrode and a drain electrode formed from the first conductive layer; and
   a gate electrode formed from a third conductive layer.

3. The display substrate of claim 1, wherein the second conductive pattern is formed from a same layer as the first electrode.

4. The display substrate of claim 1, wherein the second conductive pattern includes a transparent conductive material.

5. The display substrate of claim 1, wherein the third conductive pattern includes a transparent conductive material.

6. The display substrate of claim 1, wherein the second conductive pattern in the second pad part covers an upper surface and a side surface of the first conductive pattern.

* * * * *